(12) United States Patent
Eastman et al.

(10) Patent No.: US 11,874,032 B2
(45) Date of Patent: Jan. 16, 2024

(54) ELECTROCALORIC HEAT TRANSFER SYSTEM

(71) Applicant: CARRIER CORPORATION, Palm Beach Gardens, FL (US)

(72) Inventors: Scott Alan Eastman, Glastonbury, CT (US); Wayde R. Schmidt, Pomfret Center, CT (US); Slade R. Culp, Coventry, CT (US); Wei Xie, Malden, MA (US); Sameh Dardona, South Windsor, CT (US); Subramanyaravi Annapragada, South Windsor, CT (US); Joseph V. Mantese, Ellington, CT (US); Craig R. Walker, South Glastonbury, CT (US)

(73) Assignee: CARRIER CORPORATION, Palm Beach Gardens, FL (US)

( * ) Notice: Subject to any disclaimer, the term of this patent is extended or adjusted under 35 U.S.C. 154(b) by 355 days.

(21) Appl. No.: 17/057,466

(22) PCT Filed: Aug. 22, 2019

(86) PCT No.: PCT/US2019/047723
§ 371 (c)(1),
(2) Date: Nov. 20, 2020

(87) PCT Pub. No.: WO2020/041600
PCT Pub. Date: Feb. 27, 2020

(65) Prior Publication Data
US 2021/0164705 A1 Jun. 3, 2021

Related U.S. Application Data

(60) Provisional application No. 62/722,756, filed on Aug. 24, 2018.

(51) Int. Cl.
*F25B 21/00* (2006.01)
*H10N 15/10* (2023.01)

(52) U.S. Cl.
CPC ............. *F25B 21/00* (2013.01); *H10N 15/10* (2023.02); *F25B 2321/001* (2013.01)

(58) Field of Classification Search
CPC ... F25B 21/00; F25B 2321/001; H10N 15/10; Y02B 30/00
See application file for complete search history.

(56) References Cited

U.S. PATENT DOCUMENTS

| 2,852,811 A | 9/1958 | Petriello |
| 5,075,065 A | 12/1991 | Effenberger et al. |

(Continued)

FOREIGN PATENT DOCUMENTS

| GB | 2435683 A | 5/2007 |
| WO | 2017030529 A1 | 2/2017 |

(Continued)

OTHER PUBLICATIONS

International Search Report for International Application No. PCT/US2019/047723; Application Filing Date: Aug. 22, 2019; dated Nov. 21, 2019; 5 Pages.

(Continued)

Primary Examiner — Ana M Vazquez
(74) Attorney, Agent, or Firm — CANTOR COLBURN LLP

(57) ABSTRACT

A method of making an electrocaloric article is disclosed. The method includes mounting a supported electrocaloric film to a frame. The supported electrocaloric film includes an electrocaloric film and a first support film disposed on a first side of the electrocaloric film. An active area of the electrocaloric film is provided, which is not covered by the first support film on the first side of the electrocaloric film.

(Continued)

Electrical connections are provided to electrodes disposed on opposing sides of the electrocaloric film in the active area.

16 Claims, 5 Drawing Sheets

(56) References Cited

U.S. PATENT DOCUMENTS

| | | |
|---|---|---|
| 2011/0113791 A1 | 5/2011 | Kruglick |
| 2011/0146308 A1 | 6/2011 | Casanta |
| 2017/0030611 A1 | 2/2017 | Radcliff et al. |
| 2017/0043600 A1 | 2/2017 | Abbott, Jr. |
| 2017/0356679 A1 | 12/2017 | Annapragada et al. |
| 2017/0356680 A1 | 12/2017 | Annaprgada et al. |
| 2019/0003747 A1* | 1/2019 | Walker .................... F25B 21/00 |

FOREIGN PATENT DOCUMENTS

| | | |
|---|---|---|
| WO | 2017111916 A1 | 6/2017 |
| WO | 2017111918 A1 | 6/2017 |
| WO | 2017111919 A1 | 6/2017 |
| WO | 2017111921 A1 | 6/2017 |
| WO | 2017111922 A1 | 6/2017 |

OTHER PUBLICATIONS

Written Opinion for International Application No. PCT/US2019/047723; Application Filing Date: Aug. 22, 2019; dated Nov. 21, 2019; 5 Pages.

* cited by examiner

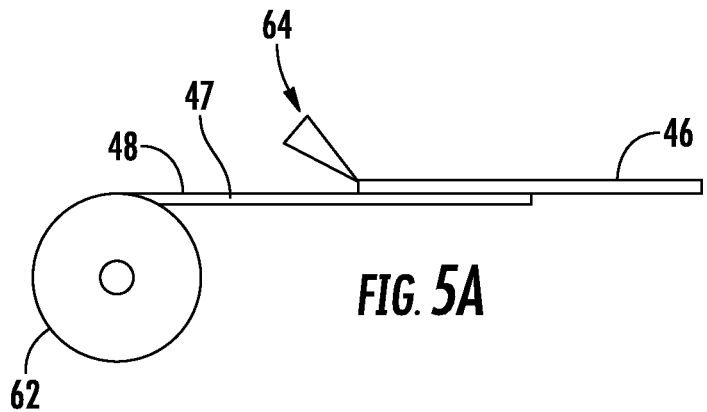
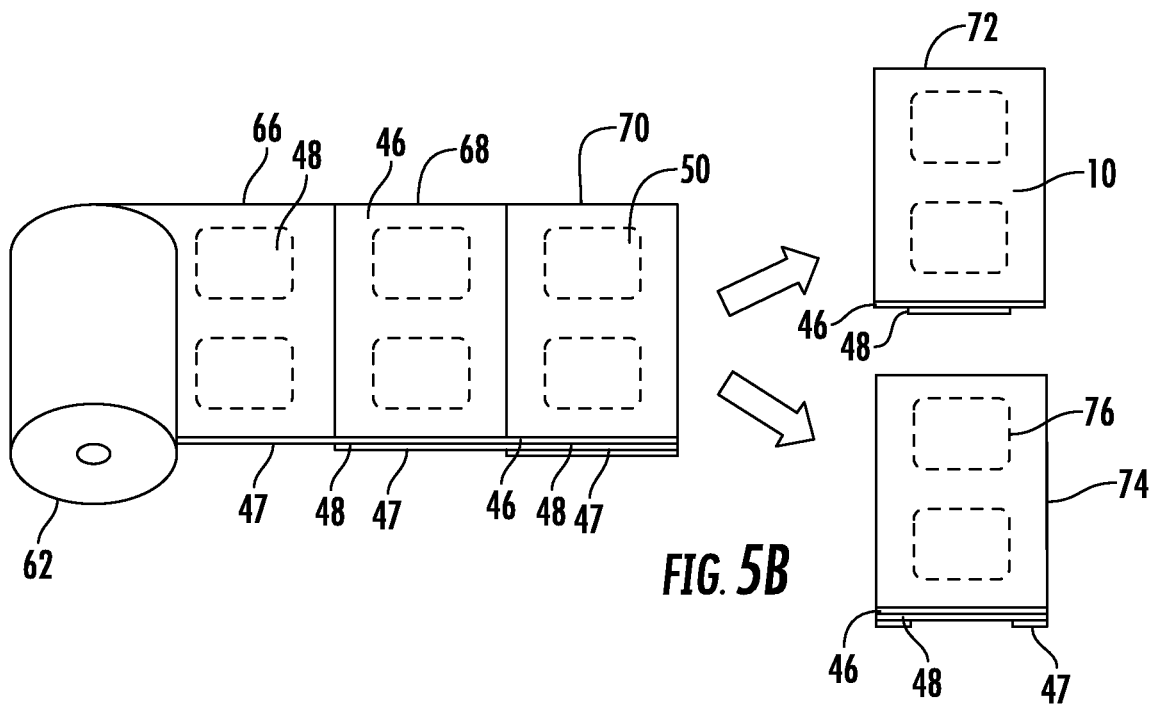

ELECTROCALORIC HEAT TRANSFER SYSTEM

CROSS REFERENCE TO RELATED APPLICATIONS

This application is a National Stage application of PCT/US2019/047723, filed Aug. 22, 2019, which claims the benefit of U.S. Provisional Application No. 62/722,756, filed Aug. 24, 2018, both of which are incorporated by reference in their entirety herein.

BACKGROUND

A wide variety of technologies exist for cooling applications, including but not limited to evaporative cooling, convective cooling, or solid state cooling such as electrothermic cooling. One of the most prevalent technologies in use for residential and commercial refrigeration and air conditioning is the vapor compression refrigerant heat transfer loop. These loops typically circulate a refrigerant having appropriate thermodynamic properties through a loop that includes a compressor, a heat rejection heat exchanger (i.e., heat exchanger condenser), an expansion device and a heat absorption heat exchanger (i.e., heat exchanger evaporator). Vapor compression refrigerant loops effectively provide cooling and refrigeration in a variety of settings, and in some situations can be run in reverse as a heat pump. However, many of the refrigerants can present environmental hazards such as ozone depleting potential (ODP) or global warming potential (GWP), or can be toxic or flammable. Additionally, vapor compression refrigerant loops can be impractical or disadvantageous in environments lacking a ready source of power sufficient to drive the mechanical compressor in the refrigerant loop. For example, in an electric vehicle, the power demand of an air conditioning compressor can result in a significantly shortened vehicle battery life or driving range. Similarly, the weight and power requirements of the compressor can be problematic in various portable cooling applications.

Accordingly, there has been interest in developing cooling technologies as alternatives to vapor compression refrigerant loops. Various technologies have been proposed such as field-active heat or electric current-responsive heat transfer systems relying on materials such as electrocaloric materials, magnetocaloric materials, or thermoelectric materials. However, many proposals have been configured as bench-scale demonstrations with limited capabilities.

BRIEF DESCRIPTION

A method of making an electrocaloric article is disclosed. The method includes mounting a supported electrocaloric film to a frame. The supported electrocaloric film includes an electrocaloric film and a first support film disposed on a first side of the electrocaloric film. An active area of the electrocaloric film is provided, which is not covered by the first support film on the first side of the electrocaloric film. Electrical connections are provided to electrodes disposed on opposing sides of the electrocaloric film in the active area.

In some embodiments, exposing the active area of the electrocaloric film includes removing the first support film from the active area of the electrocaloric film.

In some embodiments, the method further includes removing the first support film from the electrocaloric film outside of the active area.

In some embodiments, the first support film can be left in place at a peripheral portion of the electrocaloric film after attachment to the frame.

In any one or combination of the foregoing embodiments, the method can include including disposing a first of said electrodes on a surface of the first support film, disposing said surface of the first support film on the active area of the electrocaloric film, transferring the first electrode from the first support to the active area of the electrocaloric film, and removing the first support film from the active area of the electrocaloric film.

In any one or combination of the foregoing embodiments, exposing the active area of the electrocaloric film comprises disposing the first support film on a portion of the electrocaloric film outside of the active area without disposing the first support film on the active area of the electrocaloric film.

In any one or combination of the foregoing embodiments, the method further comprising removing the entirety of the first support film from the electrocaloric film after or as part of attachment of the supported electrocaloric film to the frame.

In any one or combination of the foregoing embodiments, the supported electrocaloric film further includes a second support film on a second side of the electrocaloric film, and the method includes providing the active area of the electrocaloric film not covered by the second support film on the second side of the electrocaloric film.

In any one or combination of the foregoing embodiments, exposing the active area of the electrocaloric film includes removing the second support film from the active area of the electrocaloric film.

In any one or combination of the foregoing embodiments, the method further comprising removing the second support film from the electrocaloric film outside of the active area.

In any one or combination of the foregoing embodiments, the second support film is left in place at a peripheral portion of the electrocaloric film after attachment to the frame.

In any one or combination of the foregoing embodiments, the method includes disposing a second of said electrodes on a surface of the second support film, disposing said surface of the second support film on the active area of the electrocaloric film, transferring the second electrode from the second support to the active area of the electrocaloric film, and removing the second support film from the active area of the electrocaloric film.

In any one or combination of the foregoing embodiments, exposing the active area of the electrocaloric film comprises disposing the second support film on a portion of the electrocaloric film outside of the active area without disposing the second support film on the active area of the electrocaloric film.

In any one or combination of the foregoing embodiments, the method further comprising removing the entirety of the second support film from the electrocaloric film after or as part of attachment of the supported electrocaloric film to the frame.

In any one or combination of the foregoing embodiments, the method can include removal of a portion of the first support film or the second support film along a line of perforation of the first or second support film.

Also disclosed is a method of making a heat transfer system that includes arranging one or more electrocaloric articles prepared according to the method of any one or combination of the foregoing embodiments as a stack of electrocaloric film segments with a working fluid flow path through the stack between adjacent electrocaloric film segments. The working fluid flow path is in operative thermal communication with a heat sink and a heat source at opposite ends of the working fluid flow path. The electrodes are connected to a power source configured to selectively apply voltage to activate the electrodes in coordination with fluid flow along the working fluid flow path to transfer heat from the heat source to the heat sink.

Also disclosed is a heat transfer system that includes a plurality of supported electrocaloric film segments arranged in a stack and connected to a frame. The supported electrocaloric film segments individually comprise an electrocaloric film segment and a first support film, with the support film disposed on a portion on a first side of the electrocaloric film segment and not disposed on an active portion of the electrocaloric film segment. A working fluid flow path extends through the stack between adjacent electrocaloric film segments. The working fluid flow path is in operative thermal communication with a heat sink and a heat source at opposite ends of the working fluid flow path. A plurality of electrodes are arranged to generate an electric field in the electrocaloric film segments, and are connected to a power source configured to selectively apply voltage to activate the electrodes in coordination with fluid flow along the working fluid flow path to transfer heat from the heat source to the heat sink.

In some embodiments, the plurality of supported electrocaloric film segments further individually comprise a second support film disposed on a peripheral portion on a second side of the electrocaloric film segment and not disposed on a central active portion of the electrocaloric film segment.

BRIEF DESCRIPTION OF THE DRAWINGS

The following descriptions should not be considered limiting in any way. With reference to the accompanying drawings, like elements are numbered alike:

FIGS. 5A and 5B each schematically shows an example embodiment of film roll processing fabrication techniques;

DETAILED DESCRIPTION

A detailed description of one or more embodiments of the disclosed apparatus and method are presented herein by way of exemplification and not limitation with reference to the Figures.

Figure 1A:
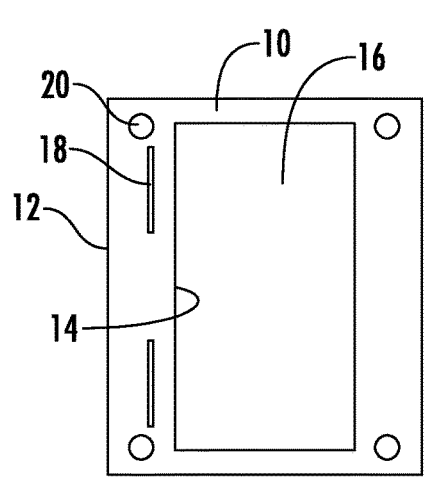
FIGS. 1A and 1B each schematically shows an example embodiment of a peripheral frame component of a heat transfer system.
Figure 1B:
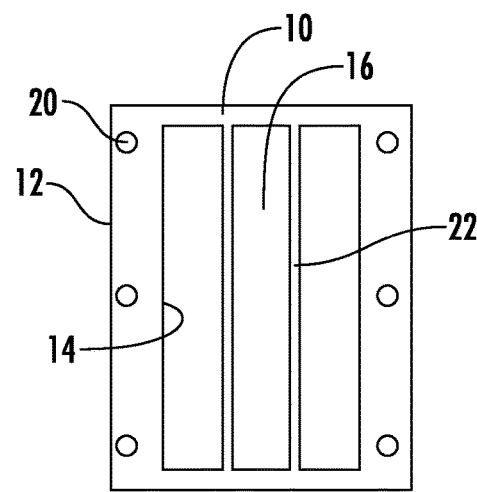

Electrocaloric articles are disclosed that include an electrocaloric film and a peripheral frame. In some embodiments, the peripheral frame can be part of a repeating modular structure that can be assembled along with a set of electrocaloric films in a stack-like fashion. In some embodiments, the peripheral frame can be a unitary structure equipped with one or more attachment points to receive one or more of electrocaloric films. Examples of modular peripheral frames 10 are shown in FIGS. 1A and 1B. As shown in FIGS. 1A and 1B, the peripheral frames 10 have an outer perimeter 12 and an inner perimeter 14, which surrounds a central opening 16. In some embodiments, the peripheral frame 10 can have slots 18 therein, which can go through the frame. The slots 18 can provide a pathway for connections such as power connections to electrodes on the electrocaloric films or to internal sensors such as temperature or flow sensors. In some embodiments, the peripheral frame 10 can include one or more alignment or retention features. For example, through-passages such as holes 20 can be utilized to align the frames 10 and other modular components, and can also accommodate retention features such as stack assembly bolts. In some embodiments, a rectangular peripheral frame 10 can include four or more alignment and/or retention features such as holes 20. Other types of alignment or retention features can be used by themselves or in combination, including but not limited to tabs, recesses, notches, interlocking features, external stack clamps or bands. In some embodiments, the peripheral frame can include one or more supports such as ribs 22 extending partly or completely across the opening 16, which can help provide support for electrocaloric films to be disposed in the opening 16. The ribs 22 can extend in various directions, including parallel to fluid flow, perpendicular to fluid flow, other orientations to fluid flow, or non-linear. In some embodiments, the support can be in the form of a sheet such as a mesh or other porous sheet extending parallel to the plane of the electrocaloric film, and can occupy a footprint in that plane that is smaller than, the same as, or larger than the footprint of the electrocaloric film.

In some embodiments, the illustrated frames are rectangular in shape, which can provide convenient edge surfaces along the module(s) for connecting functional components such as fluid flow inlet/outlet or conduits, electrical connections, etc. However, any other shape can be used including but not limited to circular, ovular, rectangular, etc. In some embodiments, the peripheral frame can extend completely around the perimeter of the film, but in some embodiments, the peripheral frame may engage with only a portion of the film perimeter. In some embodiments, multiple perimeter frame components can be used with each component covering some portion of the film perimeter. In some embodiments, the peripheral frame can be electrically non-conductive. In some embodiments, the peripheral frame can be electrically conductive. The peripheral frame can be made of various materials, including but not limited to plastics (e.g., moldable thermoplastics such as polypropylene), ceramics, aerogels, cardboard, fiber composites, or metals.

As mentioned above, the electrocaloric article includes an electrocaloric film with electrodes on opposite sides of the electrocaloric film. Examples of electrocaloric materials for the electrocaloric film can include but are not limited to inorganic (e.g., ceramics) or organic materials such as electrocaloric polymers, and polymer/ceramic composites. Composite materials such as organic polymers with inorganic fillers and/or fillers of a different organic polymer. Examples of inorganic electrocaloric materials include but are not limited to $PbTiO_3$ ("PT"), $Pb(Mg_{1/3}Nb_{2/3})O_3$ ("PMN"), PMN-PT, $LiTaO_3$, barium strontium titanate (BST) or PZT (lead, zirconium, titanium, oxygen). Examples of electrocaloric polymers include, but are not limited to ferroelectric polymers, liquid crystal polymers, and liquid crystal elastomers. Ferroelectric polymers are crystalline polymers, or polymers with a high degree of crystallinity, where the crystalline alignment of polymer chains into lamellae and/or spherulite structures can be modified by application of an electric field. Such characteristics can be provided by polar structures integrated into the polymer backbone or appended to the polymer backbone with a fixed orientation to the backbone. Examples of ferroelectric polymers include polyvinylidene fluoride (PVDF), polytriethylene fluoride, odd-numbered nylon, copolymers containing repeat units derived from vinylidene fluoride, and copolymers containing repeat units derived from triethylene fluoride. Polyvinylidene fluoride and copolymers containing repeat units derived from vinylidene fluoride have been widely studied for their ferroelectric and electrocaloric properties. Examples of vinylidene fluoride-containing copolymers include copolymers with methyl methacrylate, and copolymers with one or more halogenated co-monomers including but not limited to trifluoroethylene, tetrafluoroethylene, chlorotrifluoroethylene, trichloroethylene, vinylidene chloride, vinyl chloride, and other halogenated unsaturated monomers. In some embodiments, the electrocaloric film can include a polymer composition according to WO 2018/004518 A1 or WO 2018/004520 A1, the disclosures of which are incorporated herein by reference in their entirety.

Liquid crystal polymers, or polymer liquid crystals comprise polymer molecules that include mesogenic groups. Mesogenic molecular structures are well-known, and are often described as rod-like or disk-like molecular structures having electron density orientations that produce a dipole moment in response to an external field such as an external electric field. Liquid crystal polymers typically comprise numerous mesogenic groups connected by non-mesogenic molecular structures. The non-mesogenic connecting structures and their connection, placement and spacing in the polymer molecule along with mesogenic structures are important in providing the fluid deformable response to the external field. Typically, the connecting structures provide stiffness low enough so that molecular realignment is induced by application of the external field, and high enough to provide the characteristics of a polymer when the external field is not applied. In some exemplary embodiments, a liquid crystal polymer can have rod-like mesogenic structures in the polymer backbone separated by non-mesogenic spacer groups having flexibility to allow for re-ordering of the mesogenic groups in response to an external field. Such polymers are also known as main-chain liquid crystal polymers. In some exemplary embodiments, a liquid crystal polymer can have rod-like mesogenic structures attached as side groups attached to the polymer backbone. Such polymers are also known as side-chain liquid crystal polymers. Electrodes on the electrocaloric film can take different forms with various electrically conductive components. The electrodes can be any type of conductive material, including but not limited to metallized layers of a conductive metal such as aluminum or copper, or other conductive materials such as carbon (e.g., carbon nanotubes, graphene, or other conductive carbon). Noble metals can also be used, but are not required. Other conductive materials such as a doped semiconductor, ceramic, or polymer, or conductive polymers can also be used. In some embodiments, the electrodes can be in the form of metalized layers or patterns on each side of the film such as disclosed in published PCT application WO 2017/111921 A1 or U.S. patent application 62/521,080, the disclosures of each of which is incorporated herein by reference in its entirety.

As mentioned above, in some embodiments, a heat transfer device can include a plurality of electrocaloric films in a stack configuration arranged to provide flow paths for a working fluid between adjacent electrocaloric films. In some embodiments, the stack can include spacers between adjacent modules to provide space for such flow paths. In some embodiments, the spacers can be disposed between adjacent peripheral frames 10. Multiple spacers can be stacked together, optionally with different profiles to create 3D structures. Alternatively, or in addition to discrete spacers, portions of the peripheral frame can formed with a thickness (i.e., in a direction parallel with stack height) along the periphery of the peripheral frame 10 to provide space between adjacent electrocaloric film segments, thereby reducing or eliminating the need for a discrete spacer. In some embodiments, spacers can be disposed in the area of opening 16 between adjacent electrocaloric film segments, and can be integrated with the peripheral frame 10 such as shown for ribs 22 or can be discrete structures. In some embodiments, It should be noted that any structures disposed in the fluid flow space (e.g., ribs 22 or discrete spacers) should be configured to allow for fluid flow. For example, such structures can be configured as strips disposed in a straight-line or non-straight-line longitudinal direction generally parallel to the direction of fluid flow, and/or can be formed from a fluid-permeable material such as a mesh or screen configuration. Additionally supports can be made from tensioned filament, strand, yarn, thread or other 1 dimensional materials that can be wound around assembly bolts such as bolts through the holes. In some embodiments, spacer structures disposed in the fluid flow space between adjacent electrocaloric film segments can be made of a flexible material or structure to accommodate displacement of the electrocaloric films during energization/de-energization cycling. In some embodiments, spacer structures disposed in the fluid flow space can be in the form of a mesh or other porous sheet parallel to the electrocaloric film, and can have a footprint in that plane that is smaller than, the same as, or larger than the footprint of the electrocaloric film. In some embodiments, spacer structures between electrocaloric element electrodes at the same voltage can be electrically conductive spacer structures, which can be fabricated using printed circuit board fabrication techniques and can serve both as spacer and as electrically conductive elements. In some embodiments, the spacer can be disposed as one or more mesh or screen spacers between adjacent electrocaloric films, which can in some embodiments be configured as a mat disposed in a plane parallel to the electrocaloric film.

Figure 2:
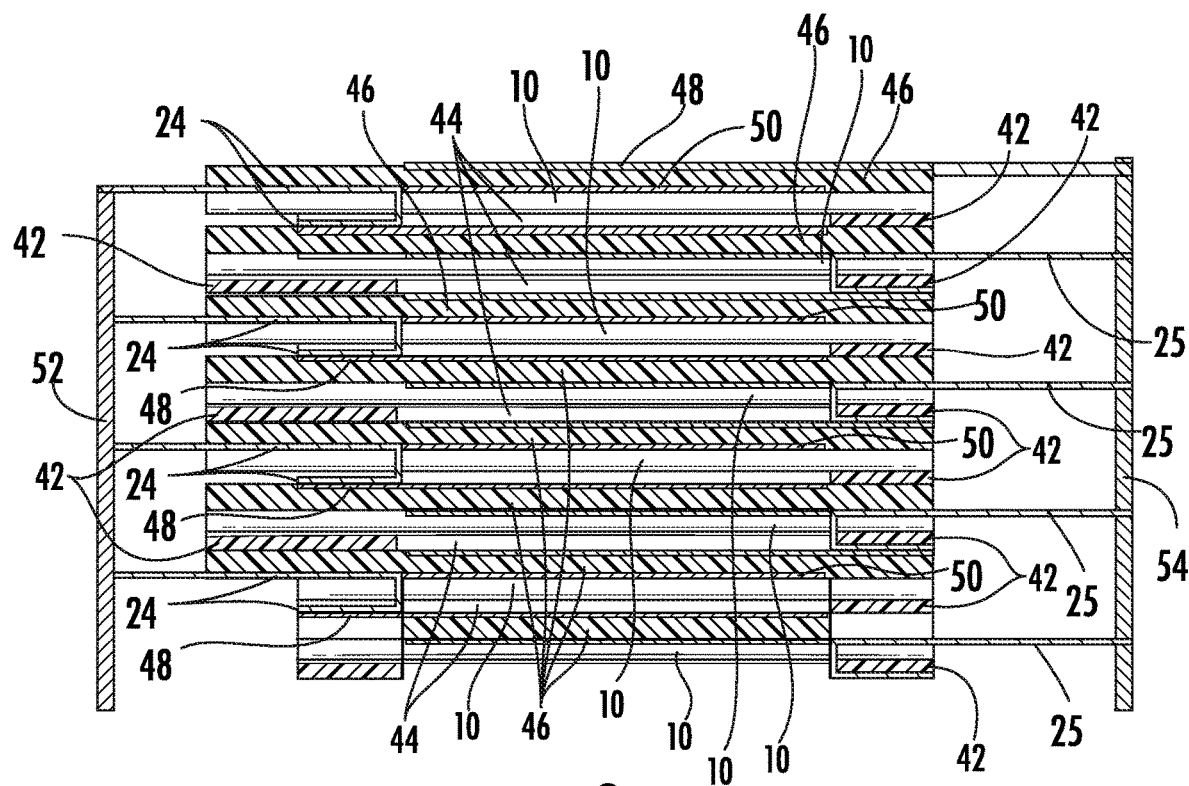
FIG. 2 schematically shows an example embodiment of a plurality of framed electrocaloric film segments in a stacked configuration.

A stack of repeating modular framed electrocaloric films 46 is schematically shown in FIG. 2. The order of assembly can be varied and adapted to achieve target specifications, and the order shown in FIG. 2 is a typical example including peripheral frames 10, spacers 42, electrocaloric elements having electrocaloric films 46 with first electrodes 48 and second electrodes 50, and first and second electrically conductive elements 24, 25 electrically connected the first and second electrodes 48, 50 and to first and second electrical buses 52, 54, respectively. As shown in FIG. 2, the electrocaloric films are disposed in the stack with a configuration such that the relative (top/bottom) orientation of the first and second electrodes 48, 50 is alternated with adjacent films so that each fluid flow path 44 has electrodes of matching polarity on each side of the fluid flow path 44, which can inhibit arcing across the flow path gap.

In some embodiments, electrocaloric film thickness can be in a range having a lower limit of 0.1 µm, more specifically 0.5 µm, and even more specifically 1 µm. In some embodiments, the film thickness range can have an upper limit of 1000 μm, more specifically 100 μm, and even more specifically 10 μm. It is understood that these upper and lower range limits can be independently combined to disclose a number of different possible ranges. Within the above general ranges, it has been discovered that thinner films can promote efficiency by reducing parasitic thermal losses, compared to thicker films. It has further been discovered that thin film and electrode structures can present a number of handling challenges during assembly. As disclosed herein, an electrocaloric film can be disposed on a support film as part of the film fabrication process and left at least partially in place through at least part of the fabrication process. In order to reduce parasitic thermal losses associated with having to heat or cool the non-active support film along with the electrocaloric film, the electrocaloric film includes an active surface area not covered by the support film. The active area of the electrocaloric film can be subjected to application and removal of an electric field during operation of an electrocaloric device coordinated with fluid flow between the electrocaloric films and a heat source and a heat sink. The non-covered active area of the electrocaloric film can be provided by removing the support film from the active area or by not covering the active area with the support film in the first place. Removal of the support film from the active area can be part of a complete removal of the support film, or alternatively all or part of the support film can be removed outside of the active area can remain in place. Removal of the support film from any area of the electrocaloric film can be accomplished by physical removal (e.g., peeling off a releasable support layer), or other methods such as evaporation or solvent or water dissolution of the support material. Removal of the support film from any area of the electrocaloric film can be performed at any point during fabrication, including before, during, or subsequent to mounting the film to a peripheral frame. In some embodiments, a removable portion of a support layer applied to the electrocaloric film can also serve as a transfer film for applying electrode(s) or other embedded components (e.g., temperature sensor) to a surface of the electrocaloric film, with materials selected and/or treated (e.g., release agents) to provide surface energies that promote transfer of the electrode or other component from the support film to the electrocaloric film. In other embodiments, an electrode (e.g., metallization) can be applied directly to the electrocaloric film. This can be accomplished by applying a metallization to an area of a supported electrocaloric film not covered by the support film (e.g., to a central portion of the film not covered by a peripherally-disposed support film, or to a side of an electrocaloric film opposite to the side joined to the support film) or before joining the electrocaloric film to the support film.

The support film can be any type of polymer, metallic or composite film, including but not limited to polymer films including polyethylene, polypropylene, polyester (e.g., polyethylene terephthalate), polyimides, polyamides, vinyl polymers (e.g., polyvinyl chloride), polycarbonates, metal foils, composite films of polymer film and metal foil or other metal layers. In some embodiments, the support film or areas of the support film can include a release agent or release layer (e.g., surface active agents and materials to lower surface energy of the film such as waxes, surfactants, polysiloxanes, lubricants, oils, fluorinated polymers (e.g., PTFE)), which can be used for example on areas of the support film to be separated from the electrocaloric film during fabrication. In some embodiments, the support film or areas of the support film can include an adhesive (e.g., acrylic adhesive, epoxy adhesive, polyurethane adhesive, or other reactive or non-reactive adhesives), which can be used for example on areas of the support film to be integrated into an electrocaloric device along with the electrocaloric film during fabrication.

As mentioned above, in some embodiments, the support film can be used to facilitate fabrication of electrocaloric devices using thin films. In some embodiments, the electrocaloric film can have a thickness of 0.1 μm to 20 μm and the support film can have a thickness of 100 μm to 15 mm. In some embodiments, the electrocaloric film can have a thickness of 1 μm to 10 μm and the support film can have a thickness of 1 mm to 5 mm. In some embodiments, the electrocaloric film can have a thickness of 3 μm to 10 μm and the support film can have a thickness of 1 mm to 3 mm.

Figure 3A:
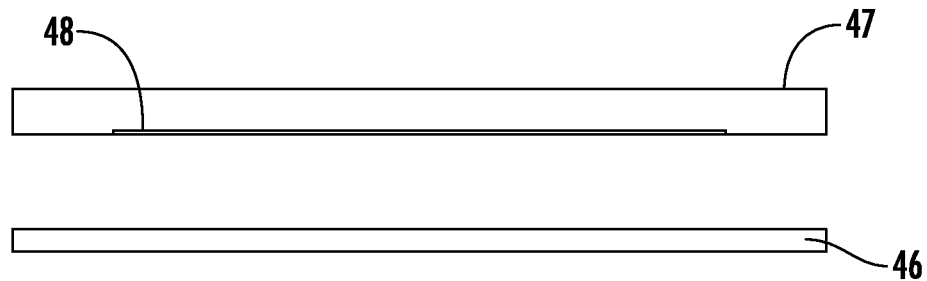
FIGS. 3A, 3B, 3C, and 3D each schematically shows an example embodiment of a method of making an electrocaloric article.
Figure 3B:
Figure 3C:
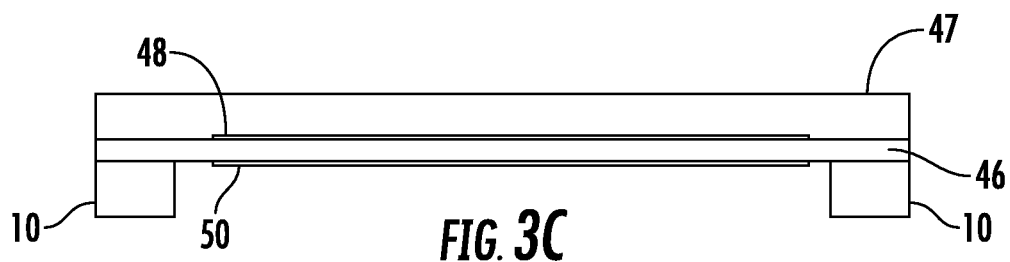
Figure 3D:
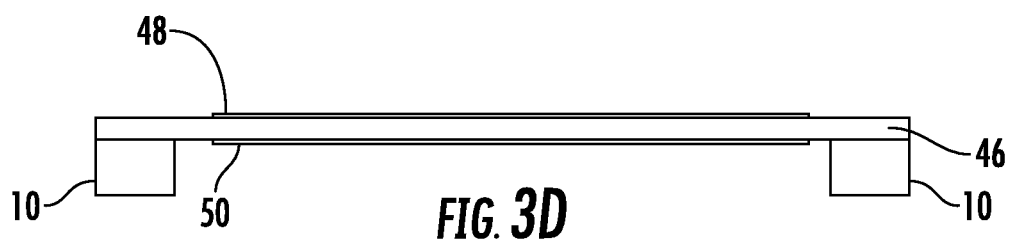

Additional disclosure regarding supported electrocaloric films and fabrication techniques is set forth below for example embodiments shown in FIGS. 3A-3D and 4A-4C. With reference now to FIGS. 3A-3D, FIG. 3A shows an electrocaloric film 46, and a support film 47 with an electrode 48 disposed thereon. In FIG. 3B, the electrocaloric film 46 and the support film 47 are joined together to form a supported electrocaloric film, and electrode 50 is added to the electrocaloric film 46. It should be noted that the electrodes 48 and 50 are schematically shown as contiguous sheet-like structures, but that they can also be configured as a patterned metallization as described in WO 2017/111921 A1 or U.S. patent application 62/521,080, referenced hereinabove. The joining of the electrocaloric film and the support film can be accomplished in various ways. For example, in some embodiments, a fluid coating of an electrocaloric polymer (either dissolved in polymer or extruded as a thermoplastic) can be deposited onto the support film 47 and solidified and the electrode 50 deposited thereon. Alternatively, a roll or sheet of the electrocaloric film 46 can be laminated with a roll or sheet of the support film 47 using pressure, heat, adhesive and/or release agent, or any combination thereof. In FIG. 3C, the supported electrocaloric film comprising the electrocaloric film 46 and the support film 47 is mounted to a peripheral frame 10. The mounted film can be affixed to the peripheral frame 10 in various ways, including but not limited to adhesive, staples, screws, friction (e.g., sandwiching the film perimeter between a frame component and a spacer). Attachment can be further enhanced with surface treatments such as plasma etching of the film attachment site on the frame. Finally, in FIG. 3D, the support film 47 is removed from the electrocaloric film 46, transferring the electrode 48 to the electrocaloric film 46. The mounted film can be incorporated into a stack such as shown in FIG. 2.

Figure 4A:
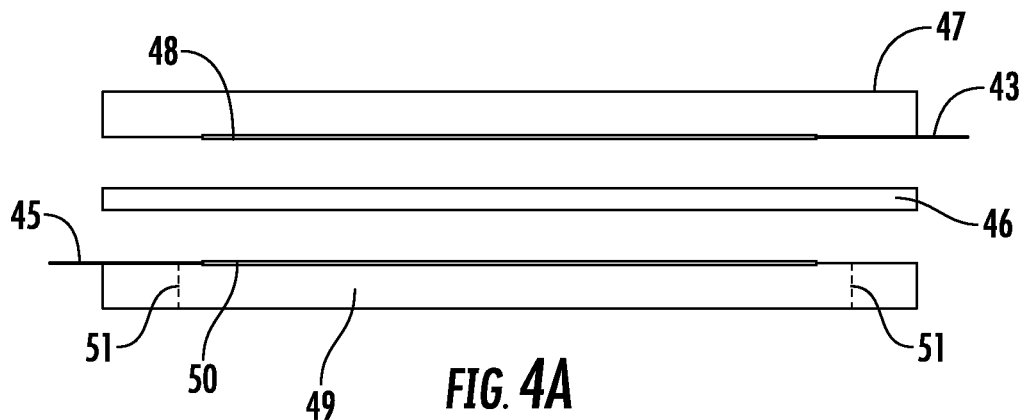
FIGS. 4A, 4B, 4C, and 4D each schematically shows another example embodiment of a method of making an electrocaloric article.
Figure 4B:
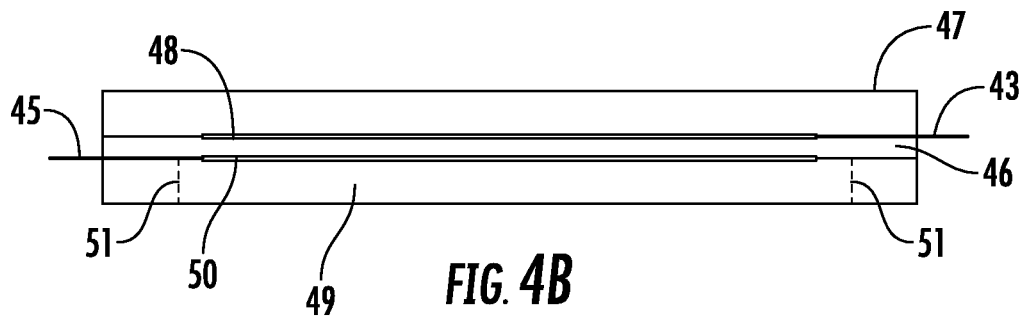
Figure 4C:
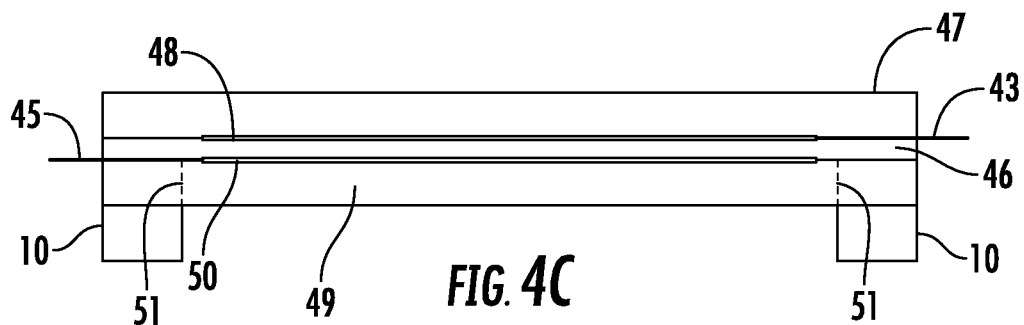
Figure 4D:
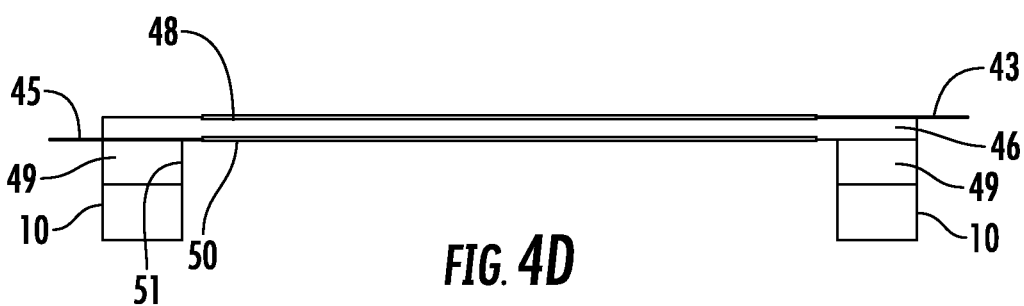

As mentioned above, in some embodiments a second support film can be utilized on a second side of the electrocaloric film. Also, in some embodiments, only a portion of the support film (e.g., a portion covering an active area of the electrocaloric film) may be removed. An example of embodiments is set forth in FIGS. 4A-4C, as described below. FIG. 4A shows an electrocaloric film 46, a support film 47 with an electrode 48 disposed thereon, and a support film 49 with an electrode 50 thereon. The support film includes electrical lead 43 and 45 connected to the electrodes 48 and 50, respectively, for providing a connection to an electrical bus in the final assembly. The support film 49 also includes perforations 51 for later removal of a portion of the support film 49. As used herein, the term "perforation" includes any pattern of removed or deformed material along a separation line, including but not limited to scored material, folded material, perforated material, as well as milling, etching, or other methods that can enable preferential separation at a designated location. In FIG. 4B, the electrocaloric film 46 and the support films 47 and 49 are joined together to form a supported electrocaloric film. In FIG. 4C, the supported electrocaloric film comprising the electrocaloric film 46 and the support films 47 is mounted to a peripheral frame 10, although in some embodiments the support film itself can act as a frame. Finally, in FIG. 4D, the support film 47 is removed from the electrocaloric film 46, transferring the electrode 48 to the electrocaloric film 46. The support film 49 is partially removed, specifically the support film is removed from the electrocaloric material along perforations 51, exposing an active area of the film with the electrodes 48 and 50 to a working fluid during operation of an electrocaloric heat transfer device, and leaving the electrical lead 45 in place for connection to an electrical bus. The mounted film can be incorporated into a stack such as shown in FIG. 2. Many variations can be made of course. For example, in some embodiments, the support film 47 can be perforated for partial removal over the electrocaloric film active area similar to the support film 49, with a peripheral portion of the support film 47 left in place. Also, the removal of the support films can also be performed after assembly of multiple films into a stack, or can be partially removed prior to mounting of the film on the frame.

Figure 6:
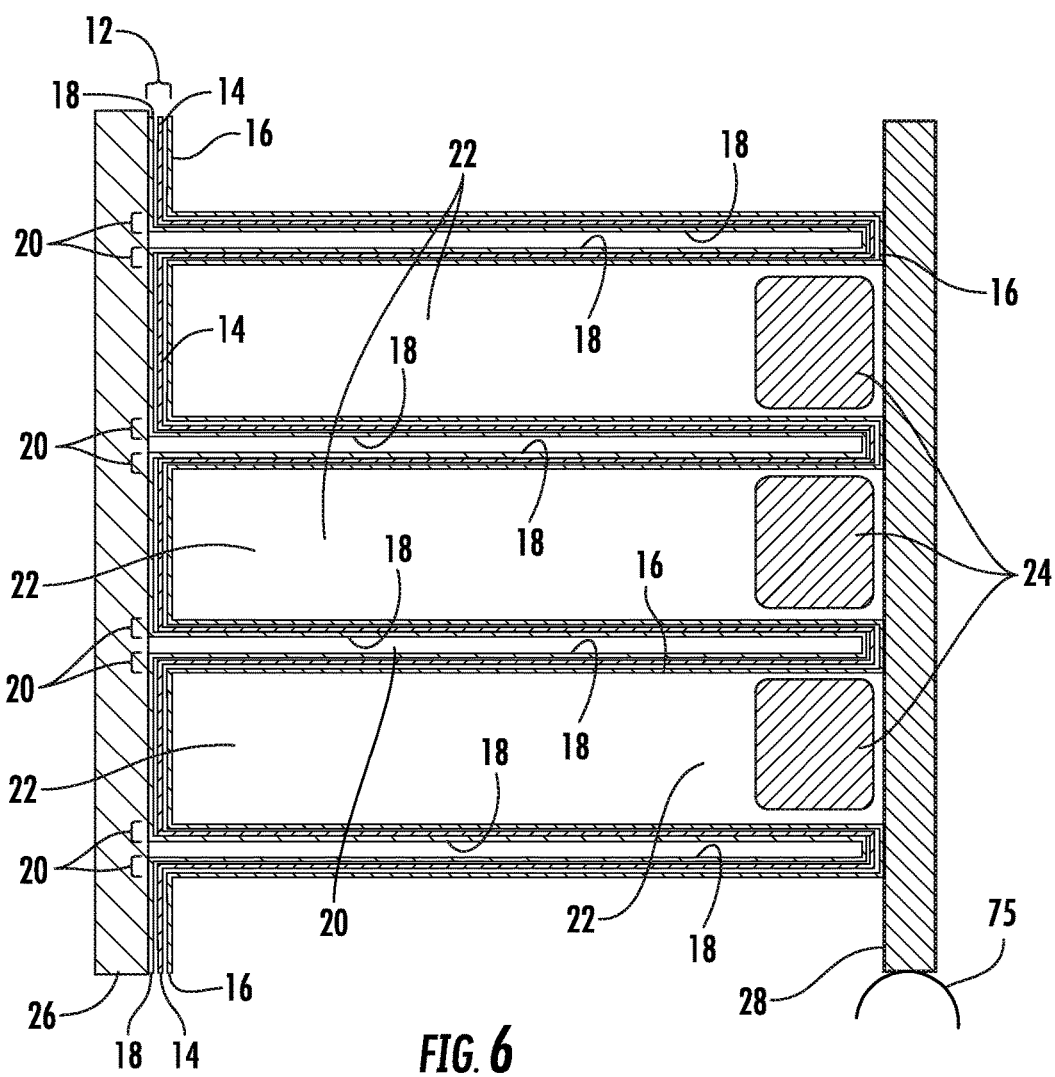
FIG. 6 schematically shows an electrocaloric article with plurality of connected aligned segments of electrocaloric film in a stack-like configuration.

The electrocaloric films, support films, electrodes and associated components can be fabricated and processed using roll-to-roll processing techniques, sheet processing techniques, or a combination thereof (e.g., some processing techniques performed roll-to-roll, which is then cut into sheets, followed by additional sheet-wise processing of the cut sheets. Example embodiments of fabrication processes are shown in FIGS. 5A and 5B. As shown in FIG. 5A, a roll 62 of a support film 47 having a metalized surface 48 for transfer of an electrode to an electrocaloric film is coated (e.g., by a blade coater 64) with a fluid layer of an electrocaloric polymer, which is then solidified to form electrocaloric film 46. FIG. 5B shows additional sequential fabrication processing. As shown in FIG. 5B, the support film 47 with metalized surface 48 is shown coming off of the roll 62 at stage 66. At stage 68, the electrocaloric film 47 has been applied to the metalized support film, and at stage 70 a metalized surface 50 is applied to the electrocaloric film 47, e.g., by transfer from a releasable transfer film (not shown) or by direct application of metallization to the surface of electrocaloric film 47. The thus-prepared metalized supported electrocaloric film can then be mounted in a frame 10 and the support film 47 completely or partially removed, as shown at stage 72. An alternative embodiment is shown at stage 74, in which the support film is removed along the perforations 76 and is left in place as a peripheral frame for the electrocaloric film, which can then be mounted on other frame components such as an end cap 26/28 (FIG. 6) or spacers 24 (FIG. 6). Additionally, it is noted that although the above Figures disclose individual segments of electrocaloric film attached to a peripheral frame in a picture-frame configuration, the supported electrocaloric films and other embodiments described herein can be used with other configurations of electrocaloric articles such as electrocaloric articles formed from a continuous sheet of electrocaloric film, or different frame configurations such as internal frame components (e.g., stack spacers) or peripheral frames covering less than the full perimeter of the electrocaloric film, or combinations of the above features with each other or other features.

An example embodiment of a configuration with the above-referenced features is schematically shown in FIG. 6, in which an electrocaloric film 12 comprises an electrocaloric polymer film 14 with a first electrode 16 on a first side of the film and a second electrode 18 on a second side of the film. As shown in FIG. 6a continuous sheet of the electrocaloric film 12 is shown folded back and forth to provide a plurality of connected aligned segments 20 arranged in a stack-like configuration with gaps 22 between the electrocaloric film segments 20. The gaps 22 can provide a flow path in a direction into or out of the page for a working fluid such as air or a heat transfer fluid. The gaps 22 between the electrocaloric film segments are maintained by internal frame components in the form of spacers 24 disposed in the gaps 22 between the aligned electrocaloric film segments 20. An electrical bus end cap 26 provides an electrical connection to the electrode 18. In some embodiments, the electrodes can be connected to a power control circuit (not shown). In some embodiments, the electrode 18 can be connected to a voltage ground and the electrode 16 can be connected to a non-ground voltage. Variations can of course be made on this design. For example, FIG. 1 shows the electrodes 16 and 18 extending continuously along the continuous sheet of electrocaloric film 12, which allows for a direct electrical connection to the end caps 26/28, which can serve as an electrical bus if they are electrically conductive. However, the metalized layers for the electrodes 16/18 can also be discontinuous, with electrical connections being provided through the spacers 24 or by one or more separate electrical leads extending through an external frame (not shown). Discontinuous metalized layers can be used, for example, in combination with separate electrical connections to a power circuit (not shown) to allow for individual control or activation of any one or combination of the segments 20 of the electrocaloric film. The continuous sheet of electrocaloric film 12 can be dispensed directly from a roll and manipulated by bending back and forth into a stack-like configuration, or can be cut into a pre-cut length and bent back and forth into the stack-like configuration.

As mentioned above, in some embodiments, a peripheral frame can be disposed on only a portion of the perimeter of an electrocaloric film. As shown in FIG. 6, the end caps 26/28 can serve as an external frame component attached along peripheral portion of the electrocaloric film 12 extending along edges parallel with a direction of fluid flow, allowing fluid inlet and outlet peripheral portions to be free of any external frame components. Additional disclosure regarding continuous sheet electrocaloric articles can be found in PCT published application no. WO2017/111916 A1, and in U.S. patent application Ser. No. 62/722,736, the disclosures of both of which are incorporated herein by reference in their entirety.

Figure 7:
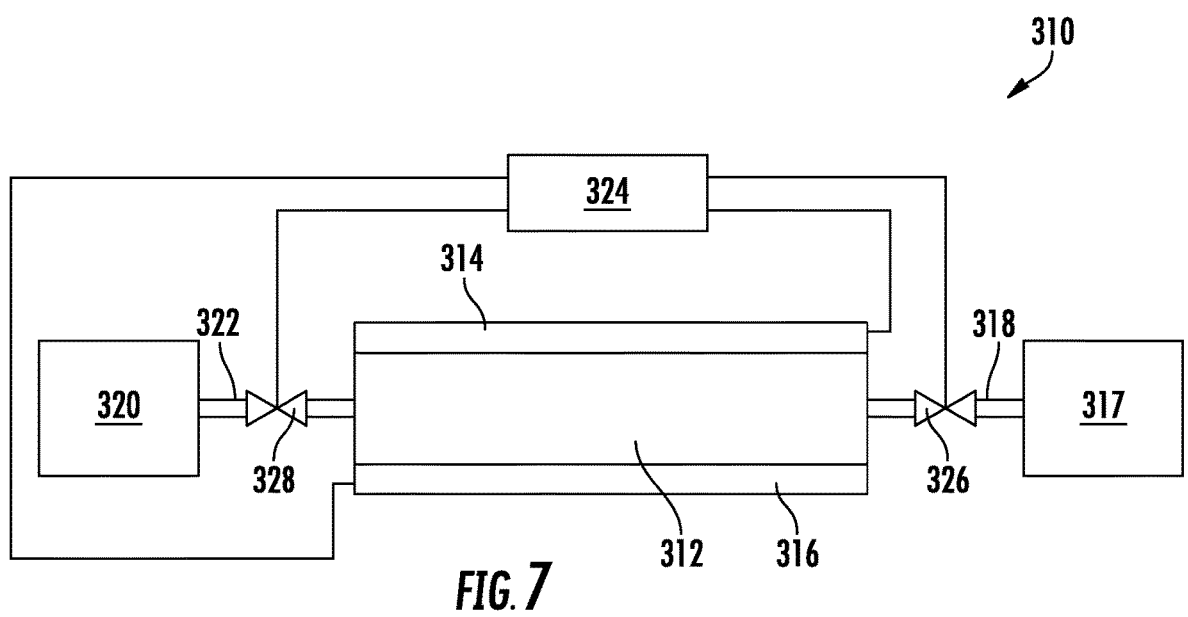
FIG. 7 is a schematic depiction of an example embodiment of an electrocaloric heat transfer system.

An example embodiment of a heat transfer system and its operation are further described with respect to FIG. 7. As shown in FIG. 7, a heat transfer system 310 comprises a stack 312 of modules with first and second electrical buses 314 and 316 in electrical communication with first and second electrodes on the electrocaloric films. The stack is in thermal communication with a heat sink 317 through a first thermal flow path 318, and in thermal communication with a heat source 320 through a second thermal flow path 322. The thermal flow paths are described below with respect to thermal transfer through flow of working fluid through control devices 326 and 328 (e.g., flow dampers) between the stack and the heat sink and heat source. A controller 324 is configured to control electrical current to through a power source (not shown) to selectively activate the buses 314, 316. In some embodiments, the module can be energized by energizing one bus bar/electrode while maintaining the other bus bar/electrode at a ground polarity. The controller 324 is also configured to open and close control devices 326 and 328 to selectively direct the working fluid along the first and second flow paths 318 and 322.

In operation, the system 310 can be operated by the controller 324 applying an electric field as a voltage differential across the electrocaloric films in the stack to cause a decrease in entropy and a release of heat energy by the electrocaloric films. The controller 324 opens the control device 326 to transfer at least a portion of the released heat energy along flow path 318 to heat sink 317. This transfer of heat can occur after the temperature of the electrocaloric films has risen to a threshold temperature. In some embodiments, heat transfer to the heat sink 317 is begun as soon as the temperature of the electrocaloric films increases to be about equal to the temperature of the heat sink 317. After application of the electric field for a time to induce a desired release and transfer of heat energy from the electrocaloric films to the heat sink 317, the electric field can be removed. Removal of the electric field causes an increase in entropy and a decrease in heat energy of the electrocaloric films. This decrease in heat energy manifests as a reduction in temperature of the electrocaloric films to a temperature below that of the heat source 320. The controller 324 closes control device 326 to terminate flow along flow path 318, and opens control device 328 to transfer heat energy from the heat source 320 to the colder electrocaloric films in order to regenerate the electrocaloric films for another cycle.

In some embodiments, for example where a heat transfer system is utilized to maintain a temperature in a conditioned space or thermal target, the electric field can be applied to the electrocaloric films to increase temperature until the temperature reaches a first threshold. After the first temperature threshold, the controller 324 opens control device 326 to transfer heat from the stack to the heat sink 317 until a second temperature threshold is reached. The electric field can continue to be applied during all or a portion of the time period between the first and second temperature thresholds, and is then removed to reduce the temperature until a third temperature threshold is reached. The controller 324 then closes control device 326 to terminate heat flow transfer along heat flow path 318, and opens control device 328 to transfer heat from the heat source 320 to the stack. The above steps can be optionally repeated until a target temperature of the conditioned space or thermal target (which can be either the heat source or the heat sink) is reached.

Although any directions described herein (e.g., "up", "down", "top", "bottom", "left", "right", "over", "under", etc.) are considered to be arbitrary and to not have any absolute meaning but only a meaning relative to other directions. For convenience, unless otherwise indicated, the terms shall be relative to the view of the Figure shown on the page, i.e., "up" or "top" refers to the top of the page, "bottom" or "under" refers to the bottom of the page, "right" to the right-hand side of the page, and "left" to the left-hand side of the page.

The term "about" is intended to include the degree of error associated with measurement of the particular quantity based upon the equipment available at the time of filing the application. For example, "about" can include a range of ±8% or 5%, or 2% of a given value.

The terminology used herein is for the purpose of describing particular embodiments only and is not intended to be limiting of the present disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

While the present disclosure has been described with reference to an exemplary embodiment or embodiments, it will be understood by those skilled in the art that various changes may be made and equivalents may be substituted for elements thereof without departing from the scope of the present disclosure. In addition, many modifications may be made to adapt a particular situation or material to the teachings of the present disclosure without departing from the essential scope thereof. Therefore, it is intended that the present disclosure not be limited to the particular embodiment disclosed as the best mode contemplated for carrying out this present disclosure, but that the present disclosure will include all embodiments falling within the scope of the claims.

What is claimed is:

1. A method of making an electrocaloric article, comprising
    mounting a supported electrocaloric film to a frame, said supported electrocaloric film comprising an electrocaloric film and a first support film disposed on a first side of the electrocaloric film;
    providing an active area of the electrocaloric film not covered by the first support film on the first side of the electrocaloric film;
    providing electrical connections to electrodes disposed on opposing sides of the electrocaloric film in the active area;
    wherein providing the active area of the electrocaloric film includes removing the first support film from the active area of the electrocaloric film.

2. The method of claim 1, further comprising removing the first support film from the electrocaloric film outside of the active area.

3. The method of claim 1, wherein the first support film is left in place at a peripheral portion of the electrocaloric film after attachment to the frame.

4. The method of claim 1, comprising disposing a first of said electrodes on a surface of the first support film, disposing said surface of the first support film on the active area of the electrocaloric film, transferring the first electrode from the first support to the active area of the electrocaloric film, and removing the first support film from the active area of the electrocaloric film.

5. The method of claim 1, wherein providing the active area of the electrocaloric film comprises disposing the first support film on a portion of the electrocaloric film outside of the active area without disposing the first support film on the active area of the electrocaloric film.

6. The method of claim 1, further comprising removing the entirety of the first support film from the electrocaloric film after or as part of attachment of the supported electrocaloric film to the frame.

7. The method of claim 1, wherein the supported electrocaloric film further comprises a second support film on a second side of the electrocaloric film, and the method comprises providing the active area of the electrocaloric film not covered by the second support film on the second side of the electrocaloric film.

8. The method of claim 7, wherein providing the active area of the electrocaloric film includes removing the second support film from the active area of the electrocaloric film.

9. The method of claim 7, further comprising removing the second support film from the electrocaloric film outside of the active area.

10. The method of claim 7, wherein the second support film is left in place at a peripheral portion of the electrocaloric film after attachment to the frame.

11. The method of claim 7, comprising disposing a second of said electrodes on a surface of the second support film, disposing said surface of the second support film on the active area of the electrocaloric film, transferring the second electrode from the second support to the active area of the electrocaloric film, and removing the second support film from the active area of the electrocaloric film.

12. The method of claim 7, wherein providing the active area of the electrocaloric film comprises disposing the second support film on a portion of the electrocaloric film outside of the active area without disposing the second support film on the active area of the electrocaloric film.

13. The method of claim 7, further comprising removing the entirety of the second support film from the electrocaloric film after or as part of attachment of the supported electrocaloric film to the frame.

14. The method of claim 7, comprising removal of a portion of the second support film along a line of perforation of the second support film.

15. A method of making a heat transfer system, comprising
arranging one or more electrocaloric articles prepared according to the method of claim 1 as a stack of electrocaloric film segments with a working fluid flow path through the stack between adjacent electrocaloric film segments, said working fluid flow path in operative thermal communication with a heat sink and a heat source at opposite ends of the working fluid flow path;
connecting the electrodes to a power source configured to selectively apply voltage to activate the electrodes in coordination with fluid flow along the working fluid flow path to transfer heat from the heat source to the heat sink.

16. A method of making an electrocaloric article, comprising:
mounting a supported electrocaloric film to a frame, said supported electrocaloric film comprising an electrocaloric film and a first support film disposed on a first side of the electrocaloric film;
providing an active area of the electrocaloric film not covered by the first support film on the first side of the electrocaloric film;
providing electrical connections to electrodes disposed on opposing sides of the electrocaloric film in the active area; and
removing a portion of the first support film along a line of perforation of the first support film.

* * * * *